United States Patent
Kawamura

[19]

[11] Patent Number: 4,589,951
[45] Date of Patent: May 20, 1986

[54] METHOD FOR ANNEALING BY A HIGH ENERGY BEAM TO FORM A SINGLE-CRYSTAL FILM

[75] Inventor: Seiichiro Kawamura, Tokyo, Japan
[73] Assignee: Fujitsu Limited, Kawasaki, Japan
[21] Appl. No.: 683,955
[22] Filed: Dec. 19, 1984

Related U.S. Application Data

[63] Continuation of Ser. No. 403,317, Jul. 30, 1982, abandoned.

[30] Foreign Application Priority Data

Jul. 30, 1981 [JP] Japan ................................ 56-120376

[51] Int. Cl.$^4$ ............................................. C30B 13/24
[52] U.S. Cl. ........................ 156/617 R; 156/DIG. 80; 156/102
[58] Field of Search ...... 156/617 R, 617 H, DIG. 80, 156/DIG. 102, DIG. 88; 427/53.1; 29/576 T; 148/DIG. 90, DIG. 48, DIG. 81; 156/603

[56] References Cited

U.S. PATENT DOCUMENTS 4,059,461  11/1977  Fan et al. .................... 156/DIG. 80
4,199,397  4/1980   Gurtler ................................ 156/620
4,330,363  5/1982   Biegesen et al. ........... 156/DIG. 80
4,388,145  6/1983   Hawkins et al. ................ 156/617 R

OTHER PUBLICATIONS

J. Electrochem. Soc., Solid-State Science and Tech., 9/81, pp. 1981-1986, Lam et al.
Bean et al, Appl. Phys. Letters, 33 (3), 8/1/78, pp. 227-230.
"Annealing of Radiation Defects by Laser Radiation Pulses", G. A. Kachurin, N. B. Pridachin, and L. S. Smirnov, *Soviet Physics Semiconductors*, p. 46.
"CW Laser Recrystallization of <100>Si on Amorphous Substrates", J. F. Gibbons and K. F. Lee, *Appl. Phys. Lett.*, 34(12), p. 831-832.

*Primary Examiner*—Hiram H. Bernstein
*Attorney, Agent, or Firm*—Staas & Halsey

[57] ABSTRACT

A large single-crystalline film on an amorphous insulator is formed by high energy beam annealing. The crystal growth of a molten polycrystalline or amorphous film on the insulator is controlled to occur from the central region toward the outer edge of the molten zone. This control is accomplished by using, for example, a doughnut-shaped laser beam.

12 Claims, 14 Drawing Figures

DONUT SHAPED LASER

METHOD FOR ANNEALING BY A HIGH ENERGY BEAM TO FORM A SINGLE-CRYSTAL FILM

This is a continuation of application Ser. No. 403,317 filed on July 30, 1982 abandoned.

BACKGROUND OF THE INVENTION

This invention relates to a method for annealing by a high energy beam, and more particularly, to a method for annealing by a high energy beam to form a large single-crystal film.

Recently, the energy of lasers has been used for annealing the defects in implanted layers of semiconductor substrates and to ensure a high density of free electrons. (Kachurin, G. A., and two others, "Annealing of Radiation Defects by Laser Radiation Pulses", Soviet Physics Semiconductors, vol. 9, No. 7, p.946, 1975). Further, methods have been proposed to recrystallize a polycrystalline film deposited on an amorphous insulator (J. F. Gibbons and K. F. Lee, "CW Laser Recrystallization of <100> Si on Amorphous Substrate", Appl. Phys. Lett. 34(12), June 15, 1979, American Institute of Physics, pp. 831 to 833). Other high energy beams such as electron beams and ion beams have been used for the same purposes and the methods using these beams are under investigation.

In the process of annealing for recrystallizing a polycrystalline film deposited on an insulator, high energy beams emitted from a high energy beam generator are focused through a lens system into a beam spot having a small diameter, e.g., 10 μm. This is applied to the film for annealing. The energy of the beams melts the polycrystalline film, which then solidifies and forms single-crystals. Such beams, however, usually have an intensity profile of Gaussian distribution, having the energy peak in the center of the circular beam. Consequently, the application of such a standard high energy beam on a polycrystalline film would result in solidification and recrystallization occurring from the peripheral parts toward the central part of the area of the melted region, thereby causing interference between the grain boundaries growing from the peripheral parts and limiting the increase in grain size and formation of large single-crystals.

SUMMARY OF THE INVENTION

It is an object, therefore, of the present invention to overcome this prior art disadvantage and limitation by providing a new and improved annealing method using high energy beams.

The above and other objects are attained by providing a method for forming a single-crystalline semiconductor film on an amorphous insulator by scanning a high energy beam over a polycrystalline or amorphous semiconductor film on the amorphous insulator. The beam is so scanned that crystal growth of a single-crystalline semiconductor occurs in the polycrystalline or amorphous film from a central region toward an outer edge of an area exposed to the high energy beam, whereby a continuous single-crystalline semiconductor film is formed.

The foregoing and other objects, features, and accompanying advantages of the present invention will be fully explained in the following detailed description using examples with reference to the accompanying drawings.

DESCRIPTION OF THE PREFERRED EMBODIMENTS

Figure 1A:
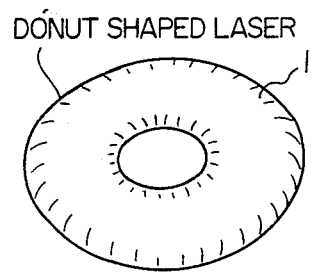
FIGS. 1(a) and 1(b) are energy models of a laser beam according to a first embodiment of the invention.

In the first embodiment of the present invention, the energy distribution or mode structure of the laser beam, usually Gaussian, is changed to a doughnut-shape. Since it is difficult to change the energy distribution of a laser beam by means of a lens system, the present inventor changed the radius of curvature or radii of the mirror or mirrors of the laser resonator to obtain a doughnut-shaped beam. An energy model of such a doughnut-shaped beam 1 is illustrated in FIG. 1(a).

Figure 1B:
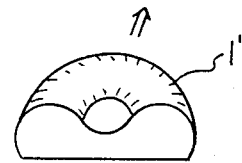
Figure 2:
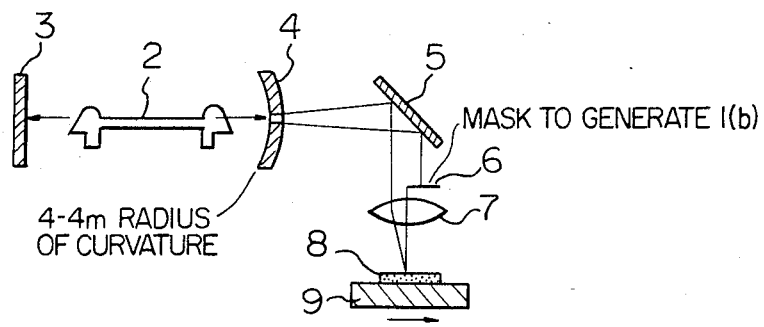
FIG. 2 is a schematic diagram of a laser system which generates the laser beam illustrated in FIGS. 1(a) and 1(b)

FIG. 2 shows a laser system which has an argon laser tube 2, a resonator composed of flat mirror 3 and a spherical mirror 4, the resonator and mirror separated from each other by 2 m. The present inventor changed the radius of curvature of mirror 4 from 6 m, which produces a Gaussian beam, to 4 m, which produces a doughnut-shaped beam as shown in FIG. 1(a). The thus generated beam is then reflected by mirror 5, focussed through lens 7, and applied to the piece 8 on stage 9. Stage 9 can be moved so that the beam can scan over piece 8. In this system, mask 6 may be inserted between mirror 4 and mirror 5 and cut the rear half of the beam in the scanning direction so as to obtain a half doughnut-shaped beam 1' as illustrated in FIG. 1(b), the scanning direction being shown by the arrow.

Figure 3A:
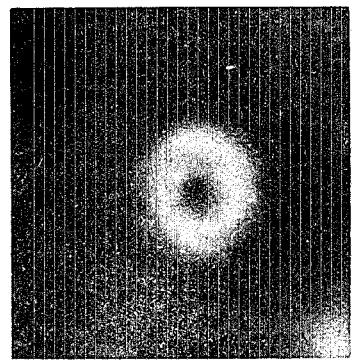
FIGS. 3(a)-3(d) are the crystallization patterns resulting from a single laser-scan over a polysilicon film on a silicon dioxide layer which is then etched.

Using a laser system as shown in FIG. 2, a doughnut-shaped beam with the mode structure shown in FIG. 3(a) was applied to the polysilicon film deposited on a silicon dioxide layer heated to a temperature of 500° C. The beam had an output power of about 10 to 15 Watts and a beam diameter of about 30 to 80 μm and scanned at a speed of about 10 cm/sec. This scan recrystallized the molten silicon from the central part toward the outer parts and from both edges toward the inner part of the melted region. The recrystallization from the central region toward the outer edge of the molten zone resulted in the formation of a single-crystal strip having a length of about 600 μm. The resultant crystal pattern is shown in FIG. 3(b).

A comparative experiment was carried out using a Gaussian laser beam obtained by means of a spherical mirror 4 having a radius of curvature of 6 m, not 4 m. The mode structure of the beam used in this experiment and the crystal pattern obtained from the experiment are shown in FIGS. 3(c) and (d).

Figure 3B:
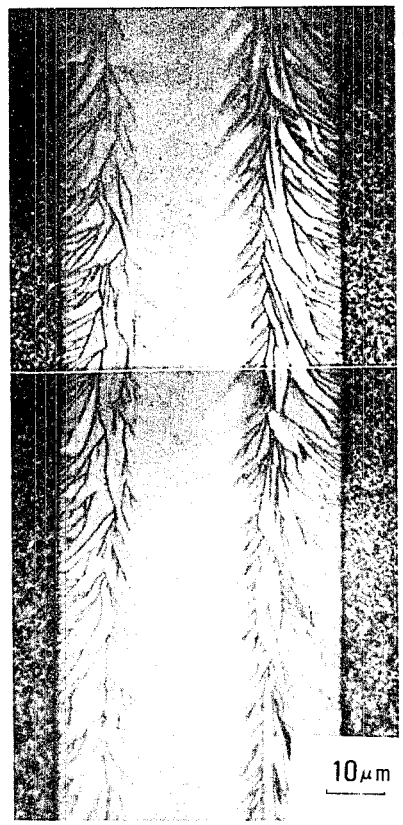
Figure 3C:
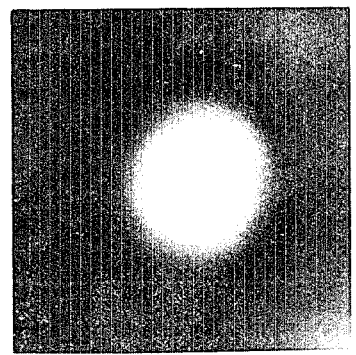
Figure 3D:
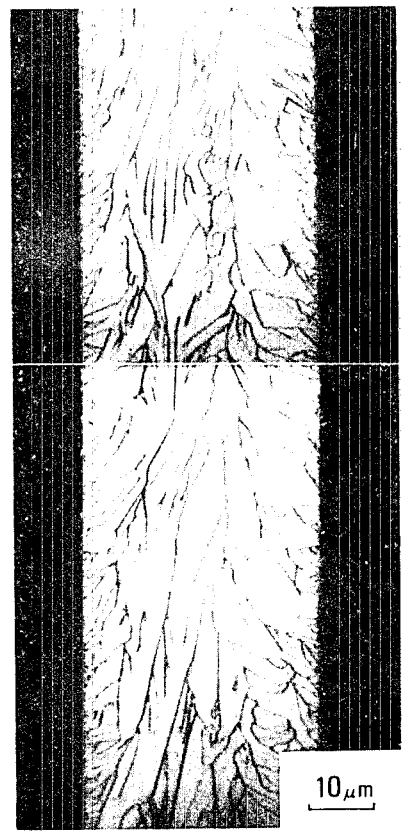

A comparison of FIG. 3(b) with FIG. 3(d) clearly shows the effect of the method according to the present invention, that is, the formation of a very large single-crystal not obtainable by the prior art method.

It should be noted that there is no fundamental restriction on the distance of the single-crystal growth over silicon dioxide that can be achieved by this procedure. The limitation of crystal growth to 600 μm in the above experiment is due only to the instability of the doughnut-shaped beam.

It should also be noted that this annealing method provides not only very long single-crystals up to ideally unlimited lengths but also very wide single-crystals up to ideally unlimited widths by scanning the beam a plurality of times while shifting the scan-line laterally. The obtained single-crystal grown from the central region toward the outer edge of the beam scan has the same crystal orientation as the neighboring single-crystal which has been formed by the former beam.

Figure 4:
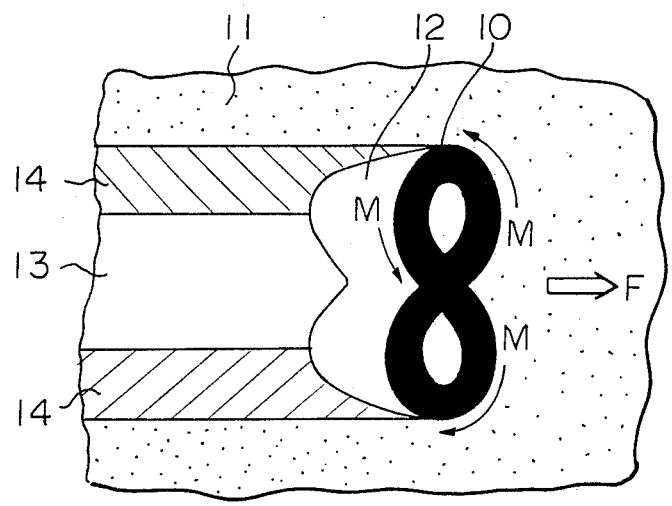
FIG. 4 is a plan view of an 8-shaped beam and the recrystallized film according to a second embodiment of the invention.

In the second embodiment of the invention, 8-shaped electron or ion beams as shown in FIG. 4 are used, wherein the beam scan-direction is indicated by arrow F. These 8-shaped beams can be made by moving the spot of the beam in the form of an 8-shape, i.e., along arrow M in FIG. 4, at a high speed (e.g., several of m/sec) and moving the piece to be recrystallized at a low speed (e.g., 10 cm/sec) which can be considered to be almost negligible compared with the former speed. In FIG. 4, scanning of such an 8-shaped beam 10 over polycrystalline or amorphous film 11 on an amorphous insulator produces melting area 12 behind the 8-shaped beam 10, which results in a large single-crystal area 13 in the central region of the molten area along the scanning direction. The effect of the scanning 8-shaped beam is similar to that described for the doughnut-shaped beams.

Figure 5:
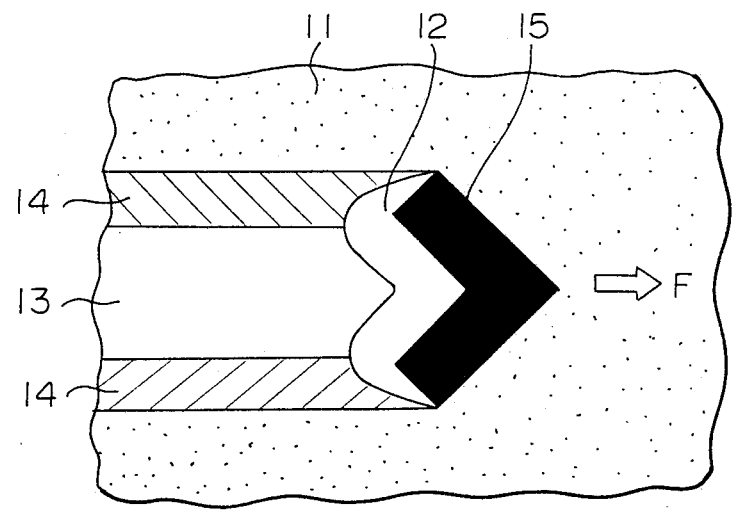
FIG. 5 is a plan view of a hook-shaped beam and the recrystallized film according to a third embodiment of the invention.

In the third embodiment of the invention, hook-shaped beam 15, as shown in FIG. 5, is used, wherein the beam-scan direction is indicated by arrow F. The hook-shaped beam can easily be obtained by using a hook-shaped slit. The effect of the hook-shaped beam is similar to that described in the preceding embodiments.

Figure 6:
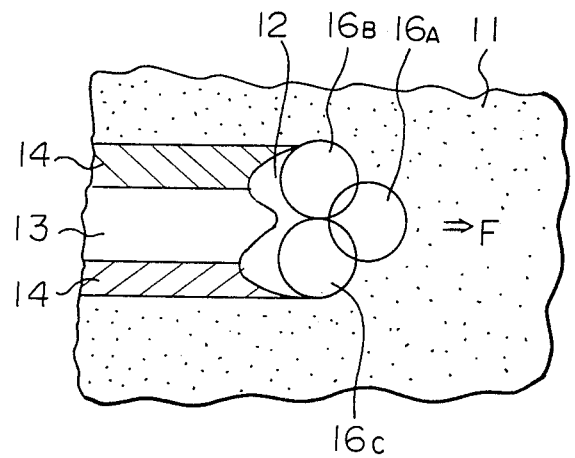
FIG. 6 is a plan view of the film scanned with three beams according to a fourth embodiment of the invention.

In the fourth embodiment of the invention, a plurality of high-energy beams which have a Gaussian distribution are used. FIG. 6 shows an arrangement of three spot beams as an example. Arrow F indicates the scan direction. Spot beam 16A which is prepositioned in the central part of the molten region plays a role of preheating and melting polycrystalline or amorphous film 11 on an amorphous insulator. In the rear of that spot, two spot beams 16B and 16C are symmetrically placed on the sides of the scan and melt the film on both sides of the laser exposed area. Molten film 12 solidifies and recrystallizes from the central part toward the outer edge of the scan, resulting in the formation of the large single-crystal 13.

Figure 7:
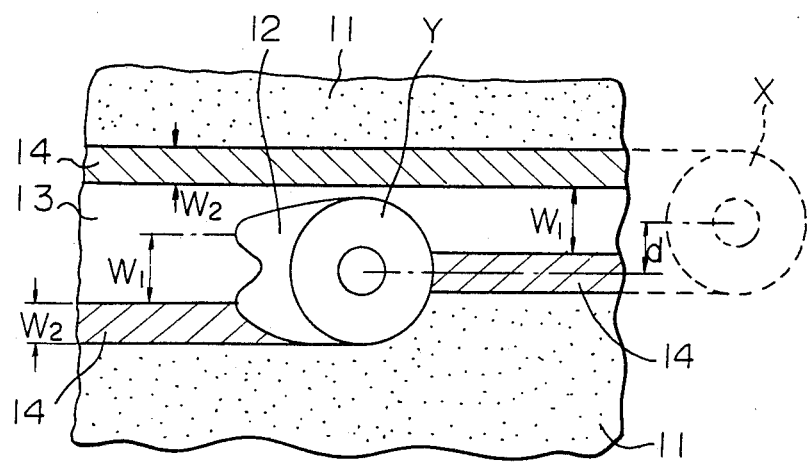
FIG. 7 is a plan view of the recrystallized film obtained by more than one time beam-scanning according to the first embodiment of the invention.

FIG. 7 illustrates, by way of example, a plurality of scannings of a doughnut-shaped beam while shifting the scan-line laterally, the scan line being indicated by beams X and Y, over a polycrystalline or amorphous film on an amorphous insulator. In such plural scannings, it is preferable that each shifting distance of two successive scan-lines satisfy the following formula:

$$W_2 < d < W_1 + W_2$$

where d denotes the shifting distance of the scan-line from the preceding line; $W_1$ denotes the width of the single-crystal region which is formed by a single beam; and $W_2$ denotes the width of the polycrystalline region which is formed on one or both sides of the central part of the single-crystal region by a single beam. This eliminates the inefficient excess overlap of crystallization and the residual polycrystalline regions between single-crystal regions due to insufficient overlap.

While, in the above described embodiments, the high energy beam itself is changed or a plurality of beams are used, a large single-crystal on an amorphous film can also be obtained with a single standard high energy beam.

Figure 8A:
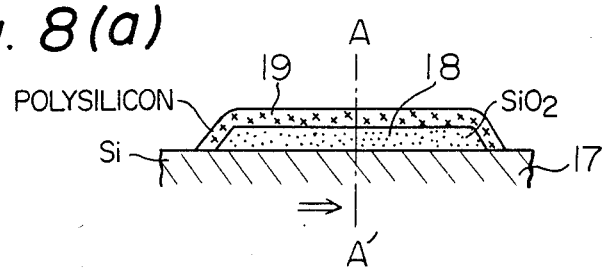
FIGS. 8(a) and 8(b) are longitudinal and cross-sectional views, respectively, of the polysilicon film on the silicon dioxide layer provided on the silicon substrate according to a fifth embodiment of the invention.
Figure 8B:
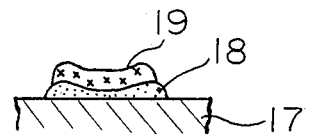

This can be achieved by changing the thickness of the amorphous insulating layer which is covered with the film to be recrystallized. Referring to FIG. 8, a high energy beam is scanned over polysilicon film 19 on silicon dioxide layer 18 provided on silicon substrate 17, the beam-scanning direction being indicated by the arrow in FIG. 8(a). FIG. 8(b) shows a cross-sectional view taken at the line A-A' in FIG. 8(a). As can be seen in FIG. 8(b), the silicon dioxide layer is thinner in its central region than in its peripheral region. The thickness is, for example, about 7000 to 8000 Å in the central region and about 1 μm in the peripheral region. This makes the molten silicon film 19 cool faster in its central region, where the silicon dioxide layer is thinner, than in its peripheral region.

As a result, the molten polysilicon film solidifies and crystallizes from its central region toward its peripheral region, thereby forming a large single-crystal of silicon along the beam-scanning direction.

Figure 9:
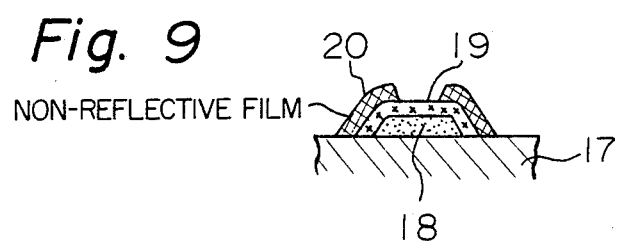
FIG. 9 is a cross-sectional view of the polysilicon film on the silicon dioxide layer, the film being partially covered with nonreflective films.

In a sixth embodiment of the invention, a large single-crystal is obtained by covering the polycrystalline or amorphous film on the amorphous insulator with a non-reflective film. Referring to FIG. 9, polysilicon film 19 on silicon dioxide layer 18 formed on silicon substrate 17 is covered with nonreflective film 20 in the peripheral region of the silicon island, so that the peripheral region of the laser annealed polysilicon film absorbs more of the energy of the laser beam than the central part of the island. The peripheral region of the recrystallized silicon film, therefore, has more energy and takes longer to cool down than the central region. This results in the formation of a large single-crystal of silicon as indicated in the preceding embodiments.

While particular embodiments of the invention have been shown and described by using several examples, it will be understood that the invention should not be limited thereto, since modifications may be made. The appended claims therefore are meant to cover any such modification as falling within the true spirit and scope of the invention.

I claim:

1. A method for forming a single-crystalline semiconductor film on an amorphous insulator, comprising the steps of:
   depositing a polycrystalline or amorphous semiconductor film on the amorphous insulator; and
   scanning a high-energy beam over the polycrystalline or amorphous semiconductor film, the high energy beam having a thermal profile such that a region of the polycrystalline or amorphous semiconductor film irradiated by the high energy beam is melted and then cooled so as to crystallize in the direction from a central region toward an outer edge of a trailing edge of an area exposed to the high-energy beam, whereby a continuous single-crystalline film is formed.

2. A method as claimed in claim 1, wherein said scanning step comprises scanning with a high-energy beam that is a doughnut-shaped laser beam.

3. A method as claimed in claim 1, wherein said scanning step comprises scanning with a high-energy beam that is half of a doughnut-shaped laser beam.

4. A method as claimed in claim 1, wherein said scanning step comprises scanning with a high-energy beam having an electron or ion beam spot that is traversed in an 8-shaped path.

5. A method as claimed in claim 1, wherein said scanning step comprises scanning with a high-energy beam that is hook-shaped.

6. A method as claimed in claim 1, wherein said scanning step comprises scanning with a plurality of high-energy beams.

7. A method as claimed in claim 1, wherein said scanning step comprises scanning with a high-energy beam comprising three spot beams, one of the spot beams being positioned in the beam-scanning zone and two of the spot beams being placed symmetrically at the rear and at first and second sides, respectively, of the spot beam in the beam-scanning zone.

8. A method as claimed in claim 1, 2, 3, 4, 5, 6 or 7, wherein said scanning step comprises shifting the scan-line laterally so the high-energy beam is scanned more than one time across the semiconductor film and the distance of the shift is selected to satisfy the following formula:

$$W_2 < d < W_1 + W_2$$

where d denotes a shifting distance of the scan-line from the preceding line, $W_1$ denotes a width of a single-crystal region which is formed by a single beam, and $W_2$ denotes a width of the polycrystalline region which is formed on first and second sides of the central single-crystal region by the single beam.

9. A method for forming a single crystalline semiconductor film on an amorphous insulator, according to claim 2, comprising the steps of:
heating the semiconductor film to a temperature of approximately 500° C.; and
scanning the heated semiconductor film with the high-energy beam which has a diameter of approximately 30–80 μm, a scanning speed of approximately 10 cm/sec., and a beam output power of approximately 10–15 Watts.

10. A method for forming a single crystalline semiconductor film on an amorphous insulator, according to claim 4, comprising the steps of:
heating the semiconductor film; and
scanning the heated semiconductor film with the high-energy beam traversed in the 8-shaped path, the beam moving at a speed of approximately several tens of meters per second and the amorphous insulator moving at a speed of approximately 10 cm/sec.

11. A method for forming a single-crystalline semiconductor film on an amorphous insulator layer, comprising the steps of:
forming the amorphous insulator layer on a semiconductor substrate, the amorphous insulator layer having a cross-sectional thickness which is thinner in the central portion than in the outer portions;
forming a polycrystalline or amorphous semiconductor film on the amorphous insulator layer; and
scanning a high energy beam over the polycrystalline or amorphous semiconductor film in a direction perpendicular to the amorphous insulator, whereby a continuous single-crystalline film is formed.

12. A method for forming a single-crystalline semiconductor film on an amorphous insulator layer, comprising the steps of:
forming a polycrystalline or amorphous semiconductor film on the amorphous insulator;
covering only the peripheral region of the polycrystalline or amorphous semiconductor film with a nonreflective film; and
scanning a high energy beam over the polycrystalline or amorphous semiconductor film formed on the amorphous insulator, whereby a continuous single-crystalline film is formed.

* * * * *